United States Patent [19]

Belfatto

[11] 4,266,201
[45] May 5, 1981

[54] METHOD AND APPARATUS USING FIRST AND SECOND PARALLEL CHANNELS, ONE OF WHICH INCLUDES AN INVERTER, FOR PRODUCING AN ELECTRICAL SIGNAL WITH AN IMPROVED ON/OFF RATIO

[75] Inventor: Robert V. Belfatto, Melbourne Beach, Fla.

[73] Assignee: Harris Corporation, Melbourne, Fla.

[21] Appl. No.: 23,350

[22] Filed: Mar. 23, 1979

[51] Int. Cl.³ .............................................. H03K 7/00
[52] U.S. Cl. ................................... 332/9 R; 375/22; 375/23
[58] Field of Search ...................... 332/9 R, 31 R, 9 T, 332/37 R, 43 B, 48; 375/21-23, 68, 61, 73; 455/304

[56] References Cited

U.S. PATENT DOCUMENTS 3,242,443  3/1966  Massaro ............................ 332/43 B Primary Examiner—Michael J. Lynch
Assistant Examiner—Edward P. Westin
Attorney, Agent, or Firm—Craig & Antonelli

[57] ABSTRACT

In certain types or electrical systems such as pulse modulators, it is extremely important that the systems have a high on/off ratio. To accomplish this, an electrical system is provided having first and second channels coupled in parallel to a frequency source. If the system is a pulse modulator, the first channel is the pulse modulation channel, and includes a first combining means coupled to the carrier frequency source and a modulation input pulse source to produce a pulse modulated output signal with "on" and "off" periods. The second channel includes a second combining means which is coupled to the carrier frequency source and a constant voltage signal to produce a continuous output signal. An inverter is provided in one of the channels to invert the carrier frequency signal going to one of the combining means. The outputs of the first and second combining means are then combined by an addition such that the continuous output signal of the second combining means is effectively subtracted from the pulse modulated output signal of the first combining means during both the "on" and "off" periods of the pulse modulated output signal due to the inversion in one of the channels. This allows for significant reduction of the undesired output signal of the first combining means caused by imbalance in the first combining means during the "off" period. And, it only causes a negligible reduction of the desired output signal during the "on" period.

30 Claims, 1 Drawing Figure

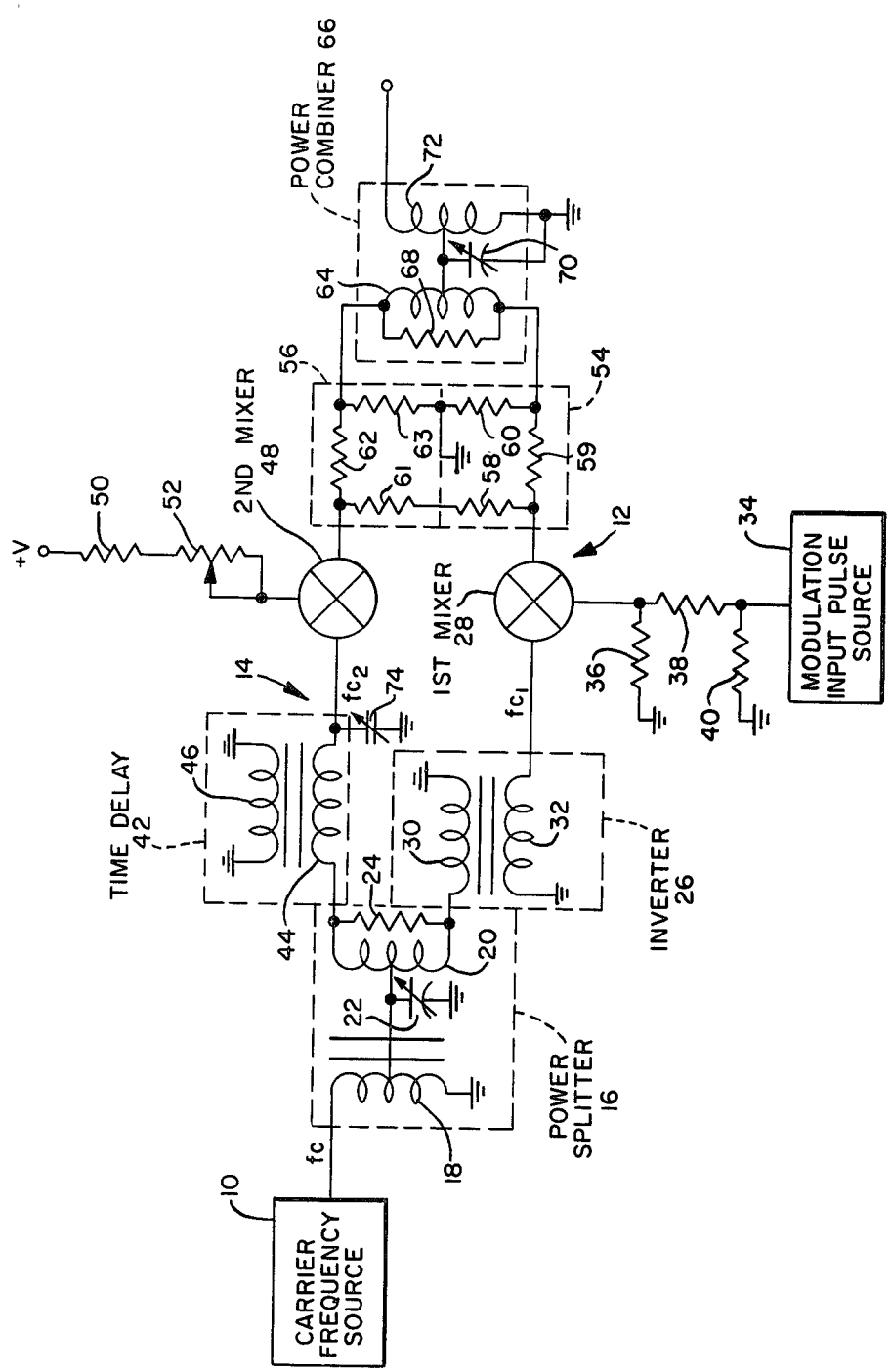

METHOD AND APPARATUS USING FIRST AND SECOND PARALLEL CHANNELS, ONE OF WHICH INCLUDES AN INVERTER, FOR PRODUCING AN ELECTRICAL SIGNAL WITH AN IMPROVED ON/OFF RATIO

FIELD OF THE INVENTION

The present invention relates generally to an electrical systems, and, more particularly, to electrical systems such as pulse modulators having means for improving the on/off ratio of the system by reducing the undesirable signal present in the pulse modulator during its "off" period.

DESCRIPTION OF THE PRIOR ART

In electrical systems such as pulse modulators a signal combiner is generally used to combine a carrier frequency signal with a modulation input pulse signal to produce a modulated output having "on" and "off" periods. Typically, such signal combiners are mixers. In certain types of pulse modulators, and especially in broadband pulse modulators such as those used for acousto-opto pulse modulation or pulsed DME (distance measuring equipment) radar equipment, a high ratio is required between the desired signal during the "on" period and the undesired signal during the "off" period. However, a serious difficulty in attaining such a high ratio results from imbalance in the mixer stage of the pulse modulator, which tends to produce a substantial output from the mixer even though it is in its "off" period. Thus, it is not uncommon for present pulse modulators using a single balanced mixer to be limited to an on/off ratio of 25 to 30 db due to this mixer imbalance. This is far below the on/off ratio of 60 db or higher frequently required in certain areas such as those mentioned above.

In the past, attempts have been made to improve this on/off ratio by applying a separate bias to the input of the mixer which introduces a dc offset. The value of the offset varies from one frequency to another. Accordingly, the useful bandwidth of the modulator is limited. Thus, this technique is not suitable for situations requiring a broad bandwidth pulse modulator.

SUMMARY

Therefore, it is an object of the present invention to provide an electrical system having an improved on/off ratio.

Further, it is an object of the present invention to provide an electrical system such as pulse modulator which improves the on/off ratio by significantly reducing the undesired signal present during the "off" period while having only a negligible effect on the desired signal during the "on" period.

To accomplish these and other objects, the present invention provides an electrical system having a frequency source and first and second parallel channels coupled to the frequency source. The first channel includes a first combining means for receiving the frequency signal from the frequency source and an information signal to produce an output signal having an "on" and "off" period. The second channel includes a second combining means for receiving the frequency signal and a signal from an additional source to produce a second output signal. An inverter is provided in one of the channels to invert the frequency signal going to one of the combining means. The output of the first and second combining means are coupled to a third combiner which adds the output of the second combining means to the output of the first combining means during both the "on" and "off" periods. The present invention also provides for a method of producing an electrical signal with an improved on/off ratio in accordance with the operation described above through the parallel channels.

BRIEF DESCRIPTION OF THE DRAWINGS

These and other objects and advantages will be apparent upon reviewing the following description and the attached drawing wherein the sole FIGURE shows an embodiment of the present invention for a pulse modulator having an improved on/off ratio.

DETAILED DESCRIPTION OF THE INVENTION

Referring now to the drawing, a pulse modulator according to the present invention is shown having a carrier frequency source 10 and two channels 12 and 14. The carrier frequency source 10 provides a carrier frequency signal $f_c$ which is coupled to the input of a power splitter 16. The power splitter 16 separates the carrier frequency signal $f_c$ into two equal amplitude carrier signals $f_{c1}$ and $f_{c2}$. This power splitter 16 can be made up, as shown, with a center tap transformer having an input coil 18, an output coil 20, a variable capacitance 22 coupled between the center tap on the transformer and ground, and a resistor 24 coupled across the output coil 20.

The first channel 12 includes an inverter 26 coupled to the $f_{c1}$ output of the power splitter 16, and a first mixer 28 coupled to the output of the inverter 26. As shown, the inverter 26 can be an inverting transformer having an input coil 30 and an output coil 32. The mixer 28 receives the inverted $f_{c1}$ input from the output coil 32. A second input to the mixer 28 is provided by the modulation input pulse source 34. Bias resistors 36, 38 and 40 are provided between the modulation input pulse source 34 and the mixer 28 to set the proper signal level. The output of the first mixer 28 is a pulse modulated output signal having "on" and "off" periods corresponding to whether or not a pulse is received from the modulation input pulse source 34.

As described above, the problem with a conventional pulse modulator using only a single mixer such as the first mixer 28 is that an output signal is produced from the mixer even when no pulse is received from the modulation input pulse source 34 (i.e. when the mixer is theoretically "off"). The higher the level of this undesired output signal, the lower the on/off ratio for the pulse modulator.

In accordance with the present invention, to compensate for this undesired signal during the "off" period of the first mixer 28, the second channel 14 is provided. This second channel 14 includes a time delay circuit 42, shown as a transformer having coils 44 and 46, wherein the coil 44 is coupled to the $f_{c2}$ output of the power splitter 16. The output of the time delay circuit 42 is coupled to an input of a second mixer 48. Another input of a second mixer 48 is coupled to a constant voltage source +V via a fixed resistor 50 and a potentiometer 52. The output of the second mixer 48 is therefore a continuous output signal. The amplitude of this continuous output signal can be controlled by adjusting the resistance of the potentiometer 52 so that the amplitude of the continuous output signal equals that of the undesired signal from the mixer 28 during the "off" period.

Attenuators 54 and 56 are respectively provided in the outputs of the first and second channel 12 and 14 to adjust the level of the output signal. These attenuators are shown as a network of resistors 58 through 63. However, any desired attenuator arrangement could be used, and such attenuation is not necessary in all cases.

The respective attenuated outputs of the mixers 28 and 48 are coupled to opposite ends of an input coil 64 of a center tap power combiner 66. As shown, the power combiner 66 also comprises a resistor 68 in parallel with an input coil 64, a variable capacitor 70 coupled between the center tap and ground, and an output coil 72 to provide an overall pulse modulated output. The power combiner 66 serves to add the continuous output of the second mixer 48 from the pulse modulated output of the first mixer 28 during both its "on" and "off" periods. Effectively, however, this addition produces a subtraction effect in producing a signal indicative of the difference between continuous output of the second mixer 48 and the pulse modulated output of the first mixer 28 due to the inversion of the carrier signal brought about by the inverter 26.

The effect of this subtraction is quite significant during the "off" period, and thereby provides a much improved "off" signal for the pulse modulator at the output coil 72. In fact, if the continuous output level of the second mixer 48 is properly set by the potentiometer 52, the signal from the first mixer 28 during the "off" period can be virtually canceled. On the other hand, the effect of the subtraction of the continuous signal from the second mixer 48 during the "on" period of the first mixer 28 is negligible since the subtracted signal is at that time so much lower than the modulated signal (e.g. typically 25 db or more below it).

To overcome any undesired phase shifts brought about by the individual components of the circuit, a variable capacitor 74 is also provided in the circuit between the output of the coil 44 of the time delay circuit 42 and ground.

Significant advantages of the above-described circuit are its overall simplicity and effectiveness. Because the output of the second mixer is continuously applied, there is no need for complicated synchronizing equipment for only applying a cancellation signal at a predetermined time. This technique has been applied in practice and 40 db improvement in extrusion ratio have been easily achieved. Of course, such circuitry could be added if desired, but generally it is not required since the amount of reduction of the output of the first mixer 28 during the "on" period by the continuous output of the second mixer 48 is extremely low.

Further, this cancellation system as described does not limit the frequency band of operation of the pulse modulator since it is not applied directly to the input of the mixer 28 in the pulse modulation channel. Accordingly, the present invention does not suffer from this disadvantage which is common in previous bias compensation techniques.

Although the above description has related primarily to pulse modulators, it is to be understood that it can also apply to related systems which combine an information signals with frequency signals.

Although the inverter 26 and the time delay 42 discussed above are shown as being in the first and second channels 12 and 14, respectively, it is to be understood that this could be reversed so that the inverter 26 will be in the second channel 14 and the time delay 42 will be in the first channel 12. Also, it is not intended that these elements should be limited to being transformers since, obviously, other types of inverters and time delay circuitry could be used.

Similarly, one could use any conventional means desired for splitting the carrier frequency signal $f_c$ into two equal components and then recombining them. Therefore, the invention is not intended to be limited to the particular center-tap transformer arrangement used for power splitting and recombining. Also, it is possible to practice the invention without an equal splitting of $f_c$ if, for some reason, it were desirable to have a larger amplitude $f_c$ signal in one channel than in the other.

Also, means other than a potentiometer 52 could be used to adjust the continuous output signal of the second mixer 48. For example, one could provide a circuit arrangement between the output of the mixer 48 and the power combiner 66 for this purpose.

It should be understood that the above description is only illustrative of the principles of the present invention, and that one with ordinary skill in the art could readily devise numerous modifications and additions to the invention as discussed without departing from its spirit and scope.

What is claimed is:

1. An electrical system having an improved on/off ratio, comprising:
    a frequency source for providing a frequency signal;
    a first channel coupled to said frequency source comprising a first combining means for receiving said frequency signal and an information signal from an information source and producing a first combined output signal having "on" and "off" periods;
    a second channel coupled to said frequency source comprising a second combining means for receiving the frequency signal and a signal from an additional signal source different than said information signal source and producing a second combined output signal;
    inverter means coupled between the frequency source and one of said first and second combining means to invert the frequency signal going to one of said first and second combining means; and
    third combining means coupled to the outputs of said first and second combining means to add the output of said second combining means to the output of said first combining means during both the "on" and "off" periods of the first combined output signal.

2. An electrical apparatus according to claim 1 wherein said first and second combining means are mixers.

3. An electrical system according to claim 1 further comprising:
    delay means coupled between the frequency source and the other of said first and second combining means to which the inverter means is not coupled, wherein said delay means has a time delay value corresponding to the time delay of the inverter means.

4. An electrical system according to claim 1 wherein the inverter means comprises an inverting transformer.

5. An electrical system according to claim 3 wherein the delay means comprises a transformer.

6. An electrical system according to claim 1 further comprising:

a power splitter coupled between the frequency source and the first and second channels to split the frequency signal into two equal amplitude signals which are respectively applied to the first and second channels.

7. An electrical system according to claim 1 further comprising:
means for adjusting the output of the second combining means to be equal to the amplitude of the output signal of the first combining means during the "off" period of said first combined output signal.

8. An electrical system according to claim 6 wherein the adjusting means comprises a potentiometer coupled between the additional signal source and the second combining means.

9. An electrical system according to claim 1 further comprising:
first and second attenuators respectively coupled between the outputs of said first and second combining means and the third combining means.

10. An electrical system according to claim 1 wherein the third combining means comprises a power combiner.

11. An electrical system according to claim 1 further comprising an adjustable capacitor coupled to one of the channels for adjusting for phase differences between said channels.

12. A pulse modulator having an improved on/off ratio comprising:
a carrier frequency source for providing a carrier frequency signal;
a first channel coupled to the carrier frequency source comprising a first combining means for receiving the carrier frequency signal and a modulation input pulse from a modulation input pulse source and producing a pulse modulated output signal having "on" and "off" periods;
a second channel coupled to the carrier frequency source comprising a second combining means for receiving the carrier frequency signal and a constant voltage signal from a constant voltage source to produce a continuous output signal;
inverter means coupled between the carrier frequency source and one of said first and second combining means to invert the carrier frequency signal going to one of said first and second combining means; and
third combining means coupled to the outputs of said first and second combining means to add the continuous output signal of said second combining means to the pulse modulated output signal of the first combining means during both the "on" and "off" periods of the pulse modulated output signal.

13. A pulse modulator according to claim 12 further comprising:
delay means coupled between the carrier frequency source and the other of said first and second combining means to which the inverter means is not coupled, wherein said delay means has a time delay value corresponding to the time delay of the inverter means.

14. A pulse modulator according to claim 12 wherein the inverter means comprises an inverting transformer.

15. A pulse modulator according to claim 12 wherein the first and second combining means comprise mixers.

16. A pulse modulator according to claim 13 wherein the delay means comprises a transformer.

17. A pulse modulator according to claim 12 further comprising:
a power splitter coupled between the carrier frequency source and the first and second channels to split the carrier frequency signal into two equal amplitude signals which are respectively applied to the first and second channels.

18. A pulse modulator according to claim 12 further comprising:
means for adjusting the output of the second combining means to be equal to the amplitude of the pulse modulated output signal of the first combining means during the "off" period of said pulse modulated output signal.

19. A pulse modulator according to claim 18 wherein the adjusting means comprises a potentiometer coupled between the constant voltage source and the second combining means.

20. A pulse modulator according to claim 12 further comprising:
first and second attenuators respectively coupled between the outputs of said first and second combining means and the third combining means.

21. A pulse modulator according to claim 12 wherein the third combining means comprises a power combiner.

22. A pulse modulator according to claim 12 further comprising an adjustable capacitor coupled to one of the channels for adjusting for phase differences between said channels.

23. A broadband pulse modulator having an improved on/off ratio comprising:
a carrier frequency source for providing a carrier frequency signal;
a power splitter coupled to said carrier frequency source for splitting said carrier frequency signal into first and second carrier frequency signals of equal amplitude;
a first channel comprising an inverter coupled to the power splitter to receive and invert said first carrier frequency signal, a mixer coupled to said inverter to receive said inverted first carrier frequency signal and coupled to a modulated input pulse source so that said mixer produces a pulse modulated output signal having "on" and "off" periods;
a second channel comprising a time delay means coupled to the power splitter to receive the second carrier frequency signal, said time delay means having a time delay equal to a time delay of the inverter, and a mixer coupled to said time delay means to receive the delayed second carrier frequency signal and coupled to a constant voltage source to produce a continuous output signal; and
a power combiner coupled to the outputs of said first and second mixers to add the continuous output signal of said second mixer to the pulse modulated output signal of the first mixer during both the "on" and "off" periods of the pulse modulated output signal.

24. A method of producing an electrical signal having an improved on/off ratio, comprising:
dividing a frequency signal into first and second component frequency signals;
inverting one of said first and second component frequency signals;

combining the first component frequency signal with an information signal to produce a first combined signal having "on" and "off" periods;

combining the second component frequency signal with an additional signal other than said information signal to produce a second combined signal; and adding said second combined signal to said first combined signal during both the "on" and "off" periods of the first combined signal to improve the on/off ratio of said first combined signal.

25. A method according to claim 24 wherein the frequency signal is a carrier frequency signal, the information signal is a pulse modulating signal, and the additional signal is a constant voltage signal, so that said first combined signal is a pulse modulated signal, and said second combined signal is a continuous output signal.

26. A method according to claim 24 or 25 further comprising delaying whichever of the first and second component frequency signals is not inverted by a time corresponding to the amount of time delay required to invert the other component frequency signal.

27. A method according to claim 24 or 25 wherein the first and second component frequency signals are of equal amplitude.

28. A method according to claim 24 or 25 further comprising adjusting the amplitude of the second combined signal to equal the amplitude of the first combined signal during the "off" period of said first combined signal.

29. A method according to claim 24 or 25 further comprising attenuating said first and second combined signals prior to subtracting them.

30. A method according to claim 24 or 25 wherein said steps of combining comprise mixing.

* * * * *

UNITED STATES PATENT AND TRADEMARK OFFICE
CERTIFICATE OF CORRECTION

PATENT NO. : 4,266,201
DATED : May 5, 1981
INVENTOR(S) : R. V. Belfatto

It is certified that error appears in the above-identified patent and that said Letters Patent are hereby corrected as shown below:

Column 1, before the heading "FIELD OF THE INVENTION", insert the following paragraph:

--The United States Government has rights in this invention pursuant to contract number MDA 904-77-C-0205 awarded by the Department of Defense.--

Signed and Sealed this

Nineteenth Day of January 1982

[SEAL]

Attest:

Attesting Officer

GERALD J. MOSSINGHOFF
Commissioner of Patents and Trademarks